United States Patent
Zimmer

Patent Number: 5,445,998
Date of Patent: Aug. 29, 1995

[54] METHOD FOR THE GLOBAL PLANARIZATION OF SURFACES OF SEMICONDUCTOR INTEGRATED CIRCUITS

[75] Inventor: Hans-Guenter Zimmer, Denzlingen, Germany

[73] Assignee: Deutsche ITT Industries GmbH, Freiburg, Germany

[21] Appl. No.: 154,670

[22] Filed: Nov. 17, 1993

[30] Foreign Application Priority Data

Nov. 20, 1992 [DE] Germany .......... 42 39 075.3

[51] Int. Cl.$^6$ .......... H01L 21/465
[52] U.S. Cl. .......... 437/228; 437/978
[58] Field of Search .......... 437/228, 978; 148/163

[56] References Cited

U.S. PATENT DOCUMENTS

| | | | |
|---|---|---|---|
| 4,505,029 | 3/1985 | Owyang et al. | 437/190 |
| 4,634,496 | 1/1987 | Mase et al. | 156/643 |
| 4,662,064 | 5/1987 | Hsu et al. | |
| 4,962,060 | 10/1990 | Sliwa et al. | 437/192 |
| 5,229,325 | 7/1993 | Park et al. | 437/190 |
| 5,262,352 | 11/1993 | Woo et al. | 437/190 |

FOREIGN PATENT DOCUMENTS

| | | |
|---|---|---|
| 0054164 | 10/1981 | European Pat. Off. |
| 0416165 | 9/1989 | European Pat. Off. |
| 0405850A3 | 6/1990 | European Pat. Off. |
| 0405850A2 | 6/1990 | European Pat. Off. |
| 0084635 | 12/1992 | European Pat. Off. |

OTHER PUBLICATIONS

Patent Abstracts of Japan, E-1224 Jun. 26, 1992 vol. 16/No. 291, Title: Manufacture of Semiconductor Device.
Patents Abstracts of Japan, E-1252 Aug. 24, 1992 vol. 16/No. 397 Title: Method of Forming Pattern.
Patents Abstracts of Japan, E274 Oct. 24, 1984 vol. 8/No. 231 Title: Flattening Method of Semiconductor Device.
Patents Abstracts of Japan E-433 Sep. 2, 1986 vol. 10/No. 255 Title: Semiconductor Device.
Patents Abstracts of Japan E-334 Aug. 9, 1985 vol. 9/No. 19 Title: Manufacture of Semiconductor Device.
Chemical Patents Index, Documentation Abstract Journal; Section EI, Week 9009, Derwent Publications Ltd., London GB; Class U, AN 90-063004 and JP-A-015 624 (Motorola Inc.) 19. Jan. 1990.
Wolf et al., vol. I, Silicon Processing for the VLSI Era, Lattice Press, 1986.
Wolf et al., vol. II, Silicon Processing for the VLSI Era, Lattice Press, 1990.

Primary Examiner—Brian E. Hearn
Assistant Examiner—Lynne A. Gurley
Attorney, Agent, or Firm—Thomas L. Peterson

[57] ABSTRACT

A method for the global planarization of surfaces of semiconductor integrated circuits which involves etching back an auxiliary layer made of a dielectric with a single auxiliary photoresist step is disclosed.

9 Claims, 2 Drawing Sheets

METHOD FOR THE GLOBAL PLANARIZATION OF SURFACES OF SEMICONDUCTOR INTEGRATED CIRCUITS

BACKGROUND OF THE INVENTION

1. Field of the Invention

The present invention relates to a method for the global planarization of surfaces of semiconductor integrated circuits wherein an auxiliary layer made of a dielectric is etched back.

2. Description of the Prior Art

A similar method is disclosed, for example, in EP 0 416 165. In this method, a locally planarized silicon-dioxide insulating layer of a given thickness is first deposited on the patterned layer to be planarized. Then, photoresist patterns are formed as an auxiliary level in an inverse pattern of the underlying pattern level. A further, highly adhering, auxiliary layer to be planarized is deposited, and the whole structure is subjected to an anisotropic etching process in which practically all auxiliary layers and the layer to be planarized are etched. Any remainder of the photoresist pattern that may be left after the etching is stripped away.

In view of the current trend toward shrinkage of feature-sizes and the resulting requirement for an increase in the optical resolution of the photolithographic equipment, topographical height variations on the semiconductor circuits are becoming increasingly less acceptable, since the depth of field of the photolithographic equipment becomes insufficient as its numerical aperture and resolution increases. As a result, unwanted portions of the photoresist may remain after the photomasking process. Such problems are inevitably compounded as the number of interconnection levels increases. Greater layer thicknesses also have detrimental effects, and if several interconnection levels are present, the layer thicknesses cannot be arbitrarily reduced.

So called local planarizations are known, which are processes in which a glass layer, for example, is caused to flow in an annealing step, or processes in which a glass layer is first deposited and then anisotropically etched back.

There are still other methods of global planarization, such as mechanical grinding of the oxide layers. They have the disadvantage of not only requiring an additional grinding device but also planarizing stepper targets. An alternative is the method referred to above.

It is the object of the invention to avoid the disadvantages of the processes described and provide a simplified sequence of steps for global planarization using conventional, proven fabrication techniques and apparatus.

The object is attained by the invention set forth in claim 1. Further advantageous aspects of the invention are characterized in the subclaims.

BRIEF SUMMARY OF THE INVENTION

The invention is an improvement in a method for planarizing an integrated circuit substrate having a plurality of structures with vertical height laterally disposed thereacross. The improvement comprises the steps of selectively forming nonconductive open-area spacers (36) between the plurality of structures. Nonconductive contiguous spacers (35) are formed contiguously adjacent to the plurality of structures (20). The plurality of structures, contiguous spacers (35) and open-area spacers (36) are then planarized by conventional techniques.

The step of selectively forming nonconductive open-area spacers (36) between the plurality of structures is performed depending upon layer thickness used on the substrate, alignment accuracy and optical properties of photolithographic exposure equipment used to define the structures on the substrate and geometry of the plurality of structures.

The invention is a also characterized as a method for the global planarization of a surface of a semiconductor integrated circuit comprising the steps of forming an interconnection pattern of conductive tracks on the surface of the substrate. A dielectric layer of thickness d is disposed over the surface of the substrate. A photoresist layer is selectively disposed over the dielectric layer and patterned to form a photoresist mask in those areas between the conductive tracks where the spacing is a multiple of the thickness, d, of the dielectric layer, taking into account alignment tolerances and optical resolution. The dielectric layer is selectively and anisotropically etched to uncover the conductive tracks and the surface of the substrate with spacers being formed at the sides of the conductive tracks. The photoresist is stripped. The surface of the semiconductor integrated circuit is then planarized using conventional techniques.

Between the step of forming an interconnection pattern of conductive tracks on the surface of the substrate and the step of disposing a dielectric layer of thickness d over the surface of the substrate, a thin dielectric layer is disposed for the purpose of preplanarization. The dielectric layer and the thin prelanarization dielectric layer is made of silicon dioxide or silicate glass.

The invention may be better visualized by now turning to the following drawings. The invention will now be explained with reference to FIGS. 1-5, which diagrammatically show successive steps of the fabrication of semiconductor circuits. Throughout the Figures, like features are designated by like reference characters.

The invention and its various embodiments are now described in the following detailed description.

DETAILED DESCRIPTION OF THE PREFERRED EMBODIMENTS

A method for the global planarization of surfaces of semiconductor integrated circuits which involves etching back an auxiliary layer made of a dielectric with a single auxiliary photoresist step is disclosed.

Figure 1:
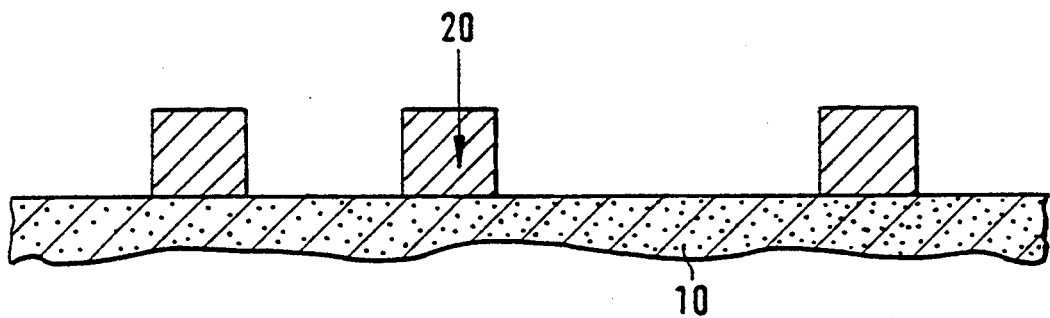
FIG. 1 is a diagrammatic side sectional view of an integrated circuit substrate, assumed to contain semiconductor devices showing a first step where conductive lines are disposed.

Starting with a semiconductor substrate 10 containing structures of a semiconductor device (not shown)

which were formed by conventional techniques, conductive tracks 20 of metal, such as aluminum, or doped polysilicon are deposited on the surface of the semiconductor substrate 10 where necessary. See FIG. 1.

Figure 2:
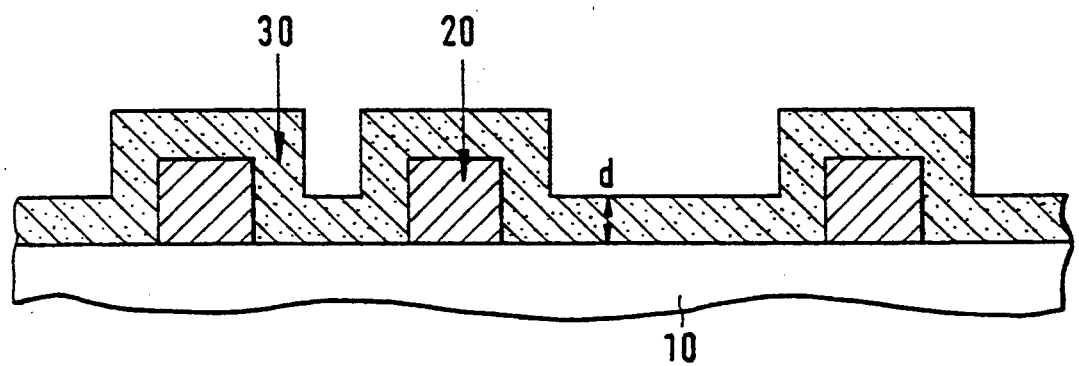
FIG. 2 is a diagrammatic side sectional view of the structure of FIG. 1 after the next step where a dielectric layer has been disposed.

The surface is then covered with a dielectric layer 30 of thickness d, e.g., an $SiO_2$ or phosphosilicate-glass layer. The method of deposition is, for example, CVD. See FIG. 2.

Figure 3:
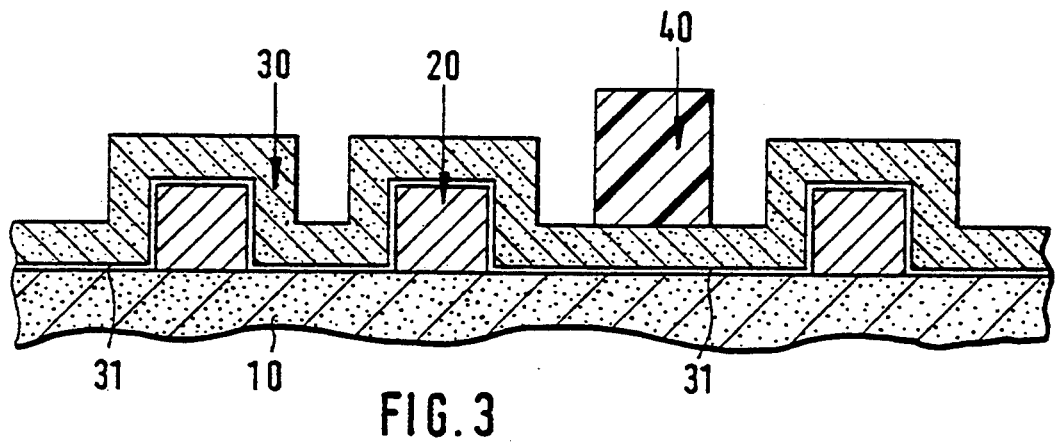
FIG. 3 is a diagrammatic side sectional view of the structure of FIG. 2 after the next step where a photoresist layer has been selectively disposed.

As the next step, a photoresist layer is applied over the entire surface and patterned in a conventional manner to form the photoresist mask 40, such that this mask partly covers the layer 30 in the area between the conductive tracks 20. The minimum spacing between the photoresist mask 40 and the conductive tracks 20 is limited by technological parameters, such as layer thicknesses, alignment accuracy and optical properties of the photolithographic exposure equipment used to define the tracks to be planarized, resolution of the exposure equipment for the photoresist mask 40, the optical properties of the tracks, etc. In practice, however, it is neither necessary nor desirable to have minimum spacings. Where the spacing of the conductive tracks 20 is too small, there is no photoresist mask 40. See FIG. 3. Typically, the areas in question are those in which the spacing of the conductive tracks 20 is greater than a multiple of the thickness of the dielectric layer 30, including the alignment tolerances and the photoresist technology.

Figure 4:
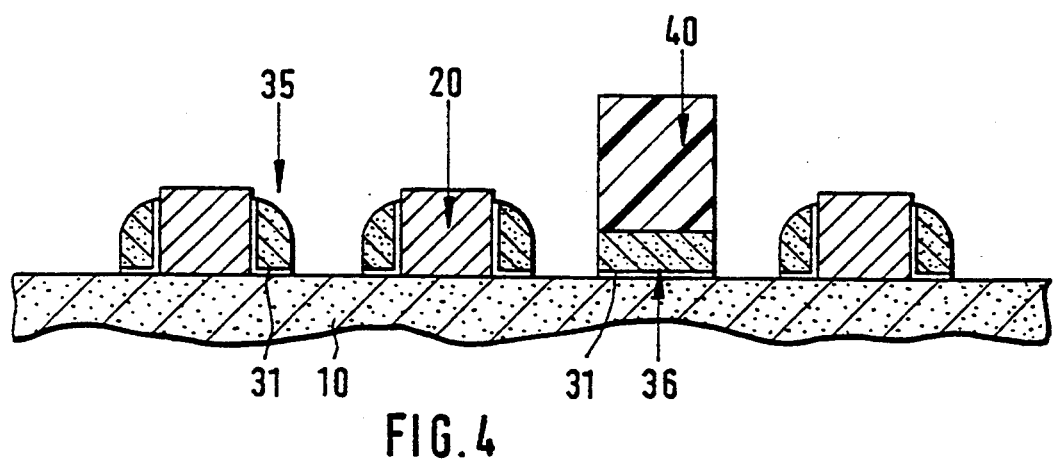
FIG. 4 is a diagrammatic side sectional view of the structure of FIG. 3 after the next step where the dielectric layer has been selectively removed.
Figure 5:
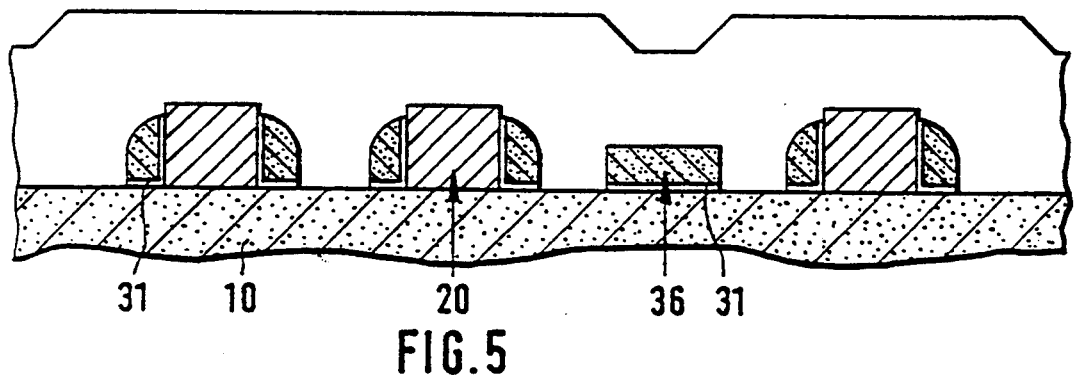
FIG. 5 is a diagrammatic side sectional view of the structure of FIG. 4 after the next step where a planarization layer has been disposed.

Next, the layer 30 is removed by anisotropic etching. See FIG. 4. At the sides of the conductive tracks 20, spacers 35 remain which represent a local planarization of the conductor level and serve to correct any undercut sides of the conductive tracks 20. Also left, simultaneously are the dielectric portions 36, which are hidden under photoresist mask 40. Photoresist mask 40 is then removed and the planarization continued in a conventional manner, so that the structure shown in FIG. 5 is obtained.

To support the desired global planarization, prior to the deposition of the dielectric layer 30, a thin dielectric layer 31 of, e.g., phosphosilicate glass may be deposited for preplanarization using the SOG technique (not shown).

A disadvantage of the method according to the invention is that an additional masking step must be introduced. On the other hand, only this method may, under certain circumstances, permit control of a reliable fabrication process. This applies particularly to circuits with nonperiodic conductor patterns. In addition, this masking step is not a critical one requiring high precision, if the additional dielectric portions are located at a sufficient distance from the structures to be planarized.

The spacers 35 at the conductive tracks, which are formed by the method, contribute to the local planarization of the topography. They are, per se, part of commonly used planarizations.

Furthermore, no additional layout effort is required, since the additional mask can be derived from the corresponding and preexisting wiring layout with a suitable computer program.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the essential idea of the invention.

I claim:

1. A method for the global planarization of a surface of a semiconductor integrated circuit comprising the steps of:

forming a pattern of conductive tracks (20) on the surface of a substrate (10);

disposing a dielectric layer (30) of thickness d over the surface of the substrate (10);

selectively disposing a photoresist layer over the dielectric layer (30) and patterning the photoresist layer to form a photoresist mask (40) in those areas between the conductive tracks (20) where the spacing between adjacent tracks is a multiple greater than the thickness, d, of the dielectric layer (30), taking into account alignment tolerances and optical resolution;

selectively and anisotropically etching the dielectric layer (30) to uncover the conductive tracks (20) and the surface of the substrate (10) with spacers (35) being formed at the sides of the conductive tracks (20);

stripping the photoresist without removing spacers (35); and planarizing the surface of the semiconductor integrated circuit.

2. The method of claim 1 where between the step of forming an interconnection pattern of conductive tracks (20) on the surface of the substrate (10) and the step of disposing a dielectric layer (30) of thickness d over the surface of the substrate (10), a thin dielectric layer (31) is disposed for the purpose of preplanarization.

3. The method of claim 1 where in the step of disposing a dielectric layer (30) of thickness d over the surface of the substrate (10), the dielectric layer 30 is made of silicon dioxide.

4. The method of claim 2 where in the step of disposing a dielectric layer of thickness d over the surface of the substrate (10), dielectric layers 30 and 31 are made of silicon dioxide.

5. The method of claim 1 where in the step of disposing a dielectric layer of thickness d over the surface of the substrate (10), the dielectric layer 30 is made of silicate glass.

6. The method of claim 2 where in the step of disposing a dielectric layer of thickness d over the surface of the substrate (10), dielectric layers 30 and 31 are made of silicate glass.

7. An improvement in a method for planarizing an integrated circuit substrate (10) having a plurality of structures (20) with vertical height laterally disposed thereacross comprising the steps of:

selectively forming nonconductive open-area spacers (36) between said plurality of structures (20);

simultaneously forming nonconductive spacers (35) contiguously adjacent to said plurality of structures (20), where the lateral distance between adjacent ones of said plurality of structures (20) is a multiple of the vertical thickness of said spacers (35, 36); and planarizing said plurality of structures (20), contiguous spacers (35) and open-area spacers (36) to provide a substantially planar surface over said plurality of structures (20), contiguous spacers (35) and open-area spacers (36).

8. The improvement of claim 7 where said step of selectively forming nonconductive open-area spacers (36) between said plurality of structures (20) is performed depending upon layer thickness of said structures (20) used on said substrate (10) and geometry of said plurality of structures (20).

9. The improvement of claim 7 where said step of selectively forming nonconductive open-area spacers (36) between said plurality of structures (20) is performed depending upon alignment accuracy and optical properties of photolithographic exposure equipment used to define said structures (20) on said substrate (10) and geometry of said plurality of structures (20).

* * * * *